(12) United States Patent
Zhang et al.

(10) Patent No.: US 9,929,695 B2
(45) Date of Patent: Mar. 27, 2018

(54) POWER AMPLIFIER, RADIO REMOTE UNIT, AND BASE STATION

(71) Applicant: Huawei Technologies Co., Ltd., Shenzhen (CN)

(72) Inventors: Lipeng Zhang, Shanghai (CN); Zhonghua Cai, Shanghai (CN); Ting Li, Shanghai (CN); Kaizhan Wang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/429,660

(22) Filed: Feb. 10, 2017

(65) Prior Publication Data

US 2017/0155364 A1    Jun. 1, 2017

Related U.S. Application Data (63) Continuation of application No. PCT/CN2014/084069, filed on Aug. 11, 2014.

(51) Int. Cl.
*H01Q 11/12* (2006.01)
*H03F 1/02* (2006.01)
(Continued)

(52) U.S. Cl.
CPC ............ *H03F 1/0222* (2013.01); *H03F 1/56* (2013.01); *H03F 3/195* (2013.01); *H03F 3/211* (2013.01);
(Continued)

(58) Field of Classification Search
None
See application file for complete search history.

(56) References Cited

U.S. PATENT DOCUMENTS 6,396,341 B1    5/2002 Pehlke
7,260,368 B1*   8/2007 Blumer ............... H03D 7/1433
                                                     455/91

(Continued)

FOREIGN PATENT DOCUMENTS

CN    1535497 A    10/2004
CN  101095281 A    12/2007
(Continued)

OTHER PUBLICATIONS

Machine Translation and Abstract of Chinese Publication No. CN101527545, Sep. 9, 2009, 14 pages.
(Continued)

*Primary Examiner* — Lana N Le
(74) *Attorney, Agent, or Firm* — Conley Rose, P.C.

(57) ABSTRACT

A power amplifier, a radio remote unit (RRU), and a base station, where the power amplifier includes an envelope controller, a main power amplifier, and an auxiliary power amplifier. The main power amplifier and the auxiliary power amplifier both set an envelope voltage output by the envelope modulator as operating voltages, and because the operating voltages of the main power amplifier and the auxiliary power amplifier may be adjusted simultaneously, symmetry of the power amplifier is improved, and an efficiency loss occurring probability is low, thereby enhancing efficiency of the power amplifier.

10 Claims, 7 Drawing Sheets

(51) Int. Cl.
- *H03F 3/195* (2006.01)
- *H03F 3/24* (2006.01)
- *H03F 3/21* (2006.01)
- *H03F 1/56* (2006.01)
- *H04B 1/16* (2006.01)

(52) U.S. Cl.
CPC ............... *H03F 3/245* (2013.01); *H04B 1/16* (2013.01); *H03F 2200/451* (2013.01); *H03F 2203/21106* (2013.01); *H03F 2203/21139* (2013.01)

(56) References Cited

U.S. PATENT DOCUMENTS

| | | | |
|---|---|---|---|
| 7,949,316 | B2 | 5/2011 | Takinami et al. |
| 7,983,632 | B2 * | 7/2011 | Zolfaghari ............ H03D 7/168 455/127.1 |
| 8,159,295 | B2 | 4/2012 | Asbeck et al. |
| 8,274,332 | B2 | 9/2012 | Cho et al. |
| 8,626,093 | B2 * | 1/2014 | Sorrells ................. H03F 1/32 455/114.3 |
| 2002/0077066 | A1 | 6/2002 | Pehlke et al. |
| 2005/0181746 | A1 | 8/2005 | Wight |
| 2006/0001483 | A1 * | 1/2006 | Cioffi ..................... H03F 1/0205 330/10 |
| 2008/0012637 | A1 | 1/2008 | Aridas et al. |
| 2009/0111397 | A1 * | 4/2009 | Dunsmore ............ H03F 1/0227 455/108 |
| 2011/0148518 | A1 | 6/2011 | Lejon et al. |
| 2012/0299659 | A1 | 11/2012 | Sankalp et al. |
| 2013/0033313 | A1 * | 2/2013 | Sorrells ................. H03F 1/32 330/69 |
| 2015/0263678 | A1 | 9/2015 | Kunihiro |
| 2017/0207752 | A1 * | 7/2017 | Lehtola ................ H03F 1/0222 455/127.1 |

FOREIGN PATENT DOCUMENTS

| | | |
|---|---|---|
| CN | 101490951 A | 7/2009 |
| CN | 101527545 A | 9/2009 |
| CN | 201426111 Y | 3/2010 |
| CN | 102165689 A | 8/2011 |
| CN | 102299689 A | 12/2011 |
| CN | 102340283 A | 2/2012 |
| CN | 102403964 A | 4/2012 |
| CN | 103430603 A | 12/2013 |
| EP | 1492228 A1 | 12/2004 |
| EP | 1499011 A1 | 1/2005 |
| EP | 2357725 A1 | 8/2011 |
| EP | 2306638 B1 | 11/2011 |
| EP | 2945285 A1 | 11/2015 |
| JP | 2009094803 A | 4/2009 |
| WO | 2014069451 A1 | 5/2014 |

OTHER PUBLICATIONS

Machine Translation and Abstract of Chinese Publication No. CN102299689, Dec. 28, 2011, 7 pages.
Machine Translation and Abstract of Chinese Publication No. CN201426111, Mar. 17, 2010, 13 pages.
Moon, J., et al., "Doherty Amplifier with Envelope Tracking for High Efficiency," IMS, 2010, pp. 1086-1089.
Foreign Communication From A Counterpart Application, PCT Application No. PCT/CN2014/084069, English Translation of International Search Report dated May 20, 2015, 2 pages.
Foreign Communication From A Counterpart Application, PCT Application No. PCT/CN2014/084069, English Translation of Written Opinion dated May 20, 2015, 12 pages.
"Doherty amplifier with cooperative power tracking and bias adaption for high efficiency", XP7141360, Research Disclo, Mason Publications, vol. 578, No. 37, May 10, 2012, 27 pages.
Foreign Communication From a Counterpart Application, European Application No. 14899825.5, Extended European Search Report dated Jul. 6, 2017, 5 pages.
Foreign Communication From A Counterpart Application, Chinese Application No. 201480031944.3, Chinese Search Report dated Oct. 18, 2017, 2 pages.
Foreign Communication From A Counterpart Application, Chinese Application No. 201480031944.3, Chinese Office Action dated Oct. 27, 2017, 5 pages.

* cited by examiner

FIG. 8

US 9,929,695 B2

POWER AMPLIFIER, RADIO REMOTE UNIT, AND BASE STATION

CROSS-REFERENCE TO RELATED APPLICATIONS

This application is a continuation of International Patent Application No. PCT/CN2014/084069 filed on Aug. 11, 2014, which is hereby incorporated by reference in its entirety.

TECHNICAL FIELD

The present application relates to wireless communications technologies, and in particular, to a power amplifier, a radio remote unit (RRU), and a base station.

BACKGROUND

A power amplifier is an important component of a radio base station, and efficiency of the power amplifier determines parameters such as power consumption, size, and heat design of the base station. Signals with a high peak-to-average ratio, particularly, have a higher requirement for a power amplifier in a base station. In order to amplify these signals with a high peak-to-average ratio without distortion, one of common methods is a power back-off method, that is, a power amplifier operates in an A-type or AB-type state, stays away from a saturation region, and enters a linear operating region, thereby improving linearity of the power amplifier. However, a disadvantage of the method lies in that a dramatic decrease in power amplification efficiency is caused, and under a same output power, energy consumption of a base station is increased greatly.

In order to improve power amplification efficiency when the power back-off method is used for amplifying a signal, the other approaches proposes that an envelope tracking (ET) amplifier and a Doherty amplifier be combined in order to improve power amplification efficiency of a signal with a high peak-to-average ratio under back off using a back-off efficiency advantage of the Doherty amplifier. In the power amplifier, a main power amplifier of the Doherty amplifier is connected to the envelope modulator, the envelope modulator performs envelope tracking on the main power amplifier, and at the same time, an auxiliary power amplifier is supplied with power using a fixed voltage. When an amplifier of such a structure operates, a loss of power amplification efficiency is easily caused, thereby having limited improvement in efficiency.

SUMMARY

Embodiments of the present disclosure provide a power amplifier, an RRU, a base station, which can improve efficiency of a power amplifier.

According to a first aspect, an embodiment of the present disclosure provides a power amplifier, including an envelope modulator, a main power amplifier, and an auxiliary power amplifier, where the envelope modulator is separately connected to a drain electrode of the main power amplifier and a drain electrode of the auxiliary power amplifier, and is configured to obtain an envelope voltage according to a received envelope signal, and output the envelope voltage separately to the drain electrode of the main power amplifier and the drain electrode of the auxiliary power amplifier. The main power amplifier is connected to the envelope modulator and is configured to set the envelope voltage received from the envelope modulator as an operating voltage, in an operating state, and perform amplification processing on a signal input from a source electrode of the main power amplifier, and the auxiliary power amplifier is parallelly connected to the main power amplifier, is connected to the envelope modulator, and is configured to set the envelope voltage received from the envelope modulator as an operating voltage in an operating state, and perform amplification processing on a signal input from a source electrode of the auxiliary power amplifier.

In a first possible implementation manner of the first aspect, the envelope modulator is further connected separately to a gate electrode of the main power amplifier and a gate electrode of the auxiliary power amplifier, and the envelope modulator is further configured to output the envelope voltage separately to the gate electrode of the main power amplifier and the gate electrode of the auxiliary power amplifier.

With reference to the foregoing possible implementation manner, in a second possible implementation manner of the first aspect, the envelope voltage is a varying voltage, and the envelope voltage has a corresponding maximum value when the envelope signal reaches a maximum value allowed by the power amplifier, or the envelope voltage is a fixed voltage.

With reference to any one of the foregoing possible implementation manners, in a third possible implementation manner of the first aspect, the power amplifier further includes an upconverter, and the upconverter is separately connected to the source electrode of the main power amplifier and the source electrode of the auxiliary power amplifier, and is configured to convert a radio frequency signal to a same operating frequency range as that of the main power amplifier and that of the auxiliary power amplifier, and output a signal obtained after conversion separately to the main power amplifier and the auxiliary power amplifier.

With reference to any one of the foregoing possible implementation manners, in a fourth possible implementation manner of the first aspect, the power amplifier further includes an impedance transformation network, connected separately to an output end of the main power amplifier and an output end of the auxiliary power amplifier, and configured to provide a phase difference between the main power amplifier and the auxiliary power amplifier.

With reference to any one of the foregoing possible implementation manners, in a fifth possible implementation manner of the first aspect, the power amplifier further includes a power divider, connected separately to the source electrode of the main power amplifier and the source electrode of the auxiliary power amplifier, and configured to divide a radio frequency signal into two signals and output the two signals separately to the main power amplifier and the auxiliary power amplifier.

With reference to any one of the foregoing possible implementation manners, in a sixth possible implementation manner of the first aspect, the envelope signal is obtained after an original envelope signal of the radio frequency signal is processed using a preset function.

According to a second aspect, an embodiment of the present disclosure provides a power amplifier, including a first envelope modulator, a second envelope modulator, a main power amplifier, and an auxiliary power amplifier, where the first envelope modulator is connected to a drain electrode of the main power amplifier, and is configured to obtain a corresponding first envelope voltage according to a received first envelope signal, and output the first envelope voltage to the drain electrode of the main power amplifier.

The second envelope modulator is connected to a drain electrode of the at least one power amplifier, and is configured to obtain a corresponding second envelope voltage according to a received second envelope signal, and output the second envelope voltage to the drain electrode of the auxiliary power amplifier. The main power amplifier is connected to the first envelope controller, and is configured to, set the first envelope voltage received from the first envelope modulator as an operating voltage in an operating state, and perform amplification processing on a signal input from a source electrode of the main power amplifier, and the auxiliary power amplifier is parallelly connected to the main power amplifier, is connected to the second envelope modulator, and is configured to set the second envelope voltage received from the second envelope modulator as an operating voltage in an operating state, and perform amplification processing on a signal input from a source electrode of the auxiliary power amplifier, where a proportional relationship between the first envelope voltage and the second envelope voltage corresponds to a ratio of an output power of the main power amplifier to that of the auxiliary power amplifier.

In a first possible implementation manner of the second aspect, the first envelope modulator is connected to a gate electrode of the main power amplifier, and the first envelope modulator is further configured to output the first envelope voltage to the gate electrode of the main power amplifier, and the second envelope modulator is connected to a gate electrode of the power amplifier, and the second envelope modulator is further configured to output the second envelope voltage to the gate electrode of the auxiliary power amplifier.

With reference to the foregoing possible implementation manners, in a second possible implementation manner of the second aspect, the power amplifier further includes an upconverter, and the upconverter is connected separately to the source electrode of the main power amplifier and the source electrode of the auxiliary power amplifier, and is configured to convert a radio frequency signal to a same operating frequency range as that of the main power amplifier and that of the auxiliary power amplifier, and output a signal obtained after conversion separately to the main power amplifier and the auxiliary power amplifier.

With reference to any one of the foregoing possible implementation manners, in a third possible implementation manner of the second aspect, the power amplifier further includes an impedance transformation network, connected separately to an output end of the main power amplifier and an output end of the auxiliary power amplifier, and configured to provide a phase difference between the main power amplifier and the auxiliary power amplifier.

With reference to any one of the foregoing possible implementation manners, in a fourth possible implementation manner of the second aspect, the power amplifier further includes a power divider, connected separately to the source electrode of the main power amplifier and the source electrode of the auxiliary power amplifier, and configured to divide a radio frequency signal into two signals and output the two signals separately to the main power amplifier and the auxiliary power amplifier.

With reference to any one of the foregoing possible implementation manners, in a fifth possible implementation manner of the second aspect, the first envelope signal and the second envelope signal are obtained after an original envelope signal of the radio frequency signal is processed using the same function or different functions.

According to a third aspect, an embodiment of the present disclosure provides an RRU, including the power amplifier provided in the first aspect or the second aspect.

According to a fourth aspect, an embodiment of the present disclosure provides a base station, including the RRU provided in the third aspect.

Using the technical solutions provided in the embodiments of the present disclosure, an envelope modulator in a power amplifier processes an envelope signal of an adjusted radio frequency signal to obtain an envelope voltage, and a main power amplifier and an auxiliary power amplifier both use the envelope voltage output by the envelope modulator as operating voltages. Because the operating voltages of the main power amplifier and the auxiliary power amplifier may be adjusted simultaneously, symmetry of the power amplifier is improved, and there is a low probability that an efficiency loss occurs. Therefore, using an efficiency advantage of a Doherty amplifier under power back-off, and in combination with an envelope tracking technology, saturation power of the power amplifier can be improved, thereby enhancing efficiency of the power amplifier. Particularly, high efficiency may be reached when a signal with high power and with a high peak-to-average ratio is amplified.

BRIEF DESCRIPTION OF DRAWINGS

To make the technical solution of the embodiments of the present disclosure clearer, the accompanying drawings for illustrating the embodiments of the present disclosure are briefly described below. The accompanying drawings illustrate some exemplary embodiments of the present disclosure only, and persons having ordinary skill in the art can derive other drawings from such accompanying drawings without any creative effort.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

Various technologies described in this specification may be applied to various communications systems, including second generation (2G) and third generation (3G) communications systems and a next-generation communications system, for example, the 2G communications system such as a Global System for Mobile Communications (GSM), the 3G communications system such as Wideband Code Division Multiple Access (WCDMA) and Time Division-Synchronization Code Division Multiple Access (TD-SCDMA), and the next-generation communications system such as a Long-Term Evolution (LTE) communications system, and a subsequent evolved system thereof.

A power amplifier provided in the embodiments of the present disclosure may be integrated in any network element device such as a base station, which needs to amplify power of a wireless signal. The power amplifier provided in the embodiments of the present disclosure may operate in a radio frequency part of the base station, for example, the power amplifier may be disposed in an RRU of the base station. The base station may be a base transceiver station (BTS) in a GSM system or in a code division multiple access (CDMA) system, or a Node B in a WCDMA system, or an evolved NodeB (e-NodeB) in an LTE system, or a similar device in an evolved communications system of LTE.

Figure 1:
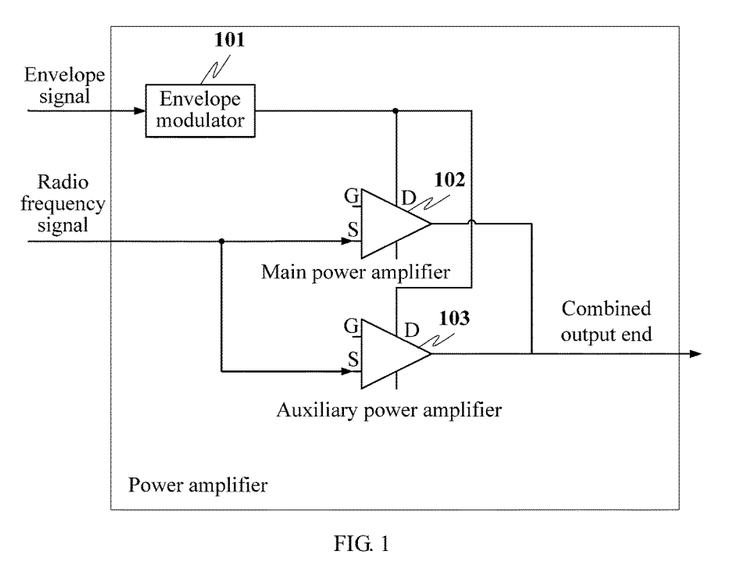
FIG. 1 is a schematic structural diagram of a power amplifier according to an embodiment of the present disclosure.

FIG. 1 is a schematic structural diagram of a power amplifier according to an embodiment of the present disclosure.

As shown in FIG. 1, the power amplifier provided in this embodiment of the present disclosure includes an envelope modulator 101, a main power amplifier 102, and an auxiliary power amplifier 103.

The envelope modulator 101 is connected separately to a drain electrode (D end) of the main power amplifier 102 and a drain electrode of the power amplifier 103, and is configured to obtain a corresponding envelope voltage according to an envelope signal, and separately output the envelope voltage to the main power amplifier 102 and the auxiliary power amplifier 103.

The envelope signal is a signal that may be used to track an operating voltage of the main power amplifier 102, that is, when an amplitude of the envelope signal is greater than a threshold, the envelope modulator 101 generates an envelope voltage that may vary with an amplitude size of the envelope signal, to replace a fixed voltage to supply power separately to the main power amplifier 102 and the auxiliary power amplifier 103. An operating voltage of the power amplifier varies with the envelope signal such that the main power amplifier 102 may be always in a near-saturation operating state.

The envelope signal may be obtained after an original envelope signal of a radio frequency signal waiting for signal amplification is processed using a function, where the function converting the original envelope signal into the envelope signal may be preset according to a requirement such as the amplitude and a phase of the output envelope signal. For example, the function may be a linear function, a quadratic function, a cubic function, or the like, which is not limited in the present disclosure. Optionally, the envelope signal may be generated by an RRU, or the like, and is input into the envelope modulator 101.

Optionally, the envelope modulator 101 may determine an amplitude of the foregoing envelope voltage according to a modulator control signal. A parameter such as a type, a phase, or an amplitude of the modulator control signal may be determined according to performance of an amplifier and may be adjusted according to an operating condition of the amplifier, which is not limited in this embodiment of the present disclosure. A digital signal may be used as the modulator control signal.

Optionally, the foregoing modulator control signal may be generated by an RRU, or the like, and is input into the envelope modulator 101, which is not limited in this embodiment of the present disclosure.

The radio frequency signal to be amplified may be obtained by converting a baseband data signal. For a specific conversion process, reference may be made to the other approaches, and details are not described herein. For example, in a distributed base station, a radio frequency signal to be amplified may be generated after a baseband data signal is processed using an intermediate frequency module and a transceiver module of an RRU, and transmitted separately to the main power amplifier 102 and the auxiliary power amplifier 103 in the power amplifier provided in this embodiment of the present disclosure.

Optionally, the envelope modulator 101 may compare the amplitude of the envelope signal with a signal threshold, and the envelope voltage is set to a fixed voltage when the amplitude of the envelope signal is less than the signal threshold, where a value of the fixed voltage may be determined and adjusted according to the foregoing modulator control signal, or the envelope voltage is set to a varying voltage when the amplitude of the envelope signal is greater than the signal threshold, where the varying voltage varies with the amplitude of the envelope signal. The envelope voltage also has a corresponding maximum voltage value when the envelope signal reaches a maximum value allowed by the power amplifier.

The foregoing signal threshold may be predetermined, within an operating voltage range allowed by the amplifier, according to a requirement, and is adjusted according to an operating condition of a system, which is not limited in this embodiment of the present disclosure.

The main power amplifier 102 is connected to the envelope modulator 101 and is configured to set the foregoing envelope voltage received from the envelope modulator 101 as an operating voltage in an operating state, and perform amplification processing on a signal input from a source electrode (S end).

The auxiliary power amplifier 103 is parallelly connected to the main power amplifier 102, is connected to the envelope modulator 101, and is configured to set the foregoing envelope voltage received from the envelope modulator 101 as an operating voltage in an operating state, and perform amplification processing on a signal input from a source electrode.

It may be understood that the signals input from the source electrodes of the main power amplifier 102 and the auxiliary power amplifier 103 may be a same radio frequency signal, or may also be signals that can represent a same radio frequency signal after being overlapped.

Optionally, a same fixed voltage is input into the main power amplifier 102 and the auxiliary power amplifier 103 as an operating voltage when the envelope signal is less than a preset threshold. In this case, the power amplifier provided in this embodiment of the present disclosure is equivalent to a standard Doherty amplifier, and in this operating mode, the power amplifier may implement power amplification of a radio frequency signal with a wide bandwidth, of modulation signals. A same varying voltage that varies with the amplitude of the envelope signal is input into the main power amplifier 102 and the auxiliary power amplifier 103 as an operating voltage when the envelope signal is greater than the preset threshold. In this case, the power amplifier is a Doherty amplifier using envelope tracking, that is, the power amplifier operates in a cooperative state of the envelope tracking and the Doherty amplifier, and in this operating mode, the power amplifier has a good amplification effect for a modulation signal of high power and of a high peak-to-average ratio.

Further, the envelope modulator 101 is separately connected to the drain electrodes of the main power amplifier 102 and the auxiliary power amplifier 103. The envelope voltage obtained by being processed by the envelope modulator 101 is input separately from the drain electrodes of the main power amplifier 102 and the auxiliary power amplifier 103, and is used as the operating voltage of the drain electrodes, to supply power for the main power amplifier 102 and the auxiliary power amplifier 103.

It may be understood that under control of a gate voltage, regardless of whether the operating voltages of the drain electrodes are fixed voltages or are varying voltages, the main power amplifier 102 is always biased in an AB-type operating state, and the auxiliary power amplifier 103 is always biased in a C-type operating state.

Figure 2:
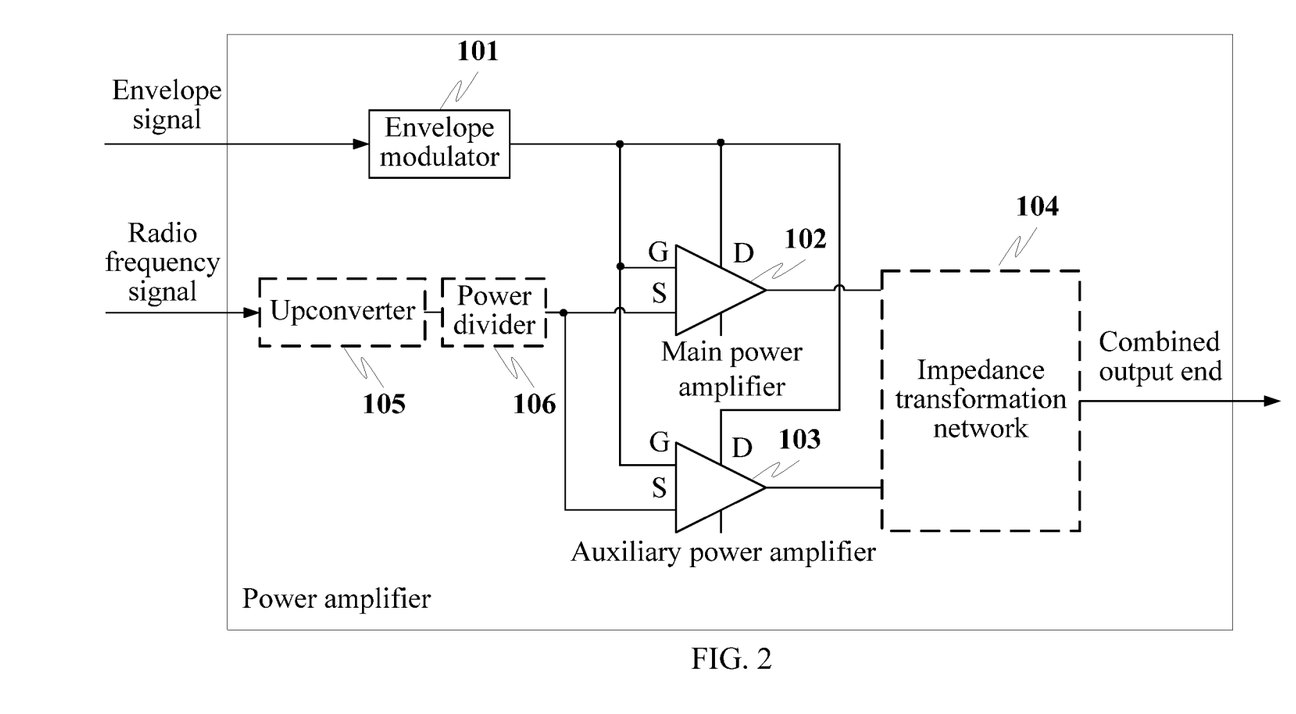
FIG. 2 is a schematic structural diagram of a power amplifier according to an embodiment of the present disclosure.

Optionally, as another embodiment of the present disclosure, as shown in FIG. 2, an envelope modulator 101 may further be separately connected to a gate electrode (G end) of a main power amplifier 102 and a G end of an auxiliary power amplifier 103, and outputs an envelope voltage separately to the gate electrodes of the main power amplifier 102 and the auxiliary power amplifier 103 in order to assist in controlling, using the envelope voltage as a gate voltage, operating states of the main power amplifier 102 and the auxiliary power amplifier 103, thereby further adjusting a power amplification gain, and improving power amplification performance.

In an actual implementation, the envelope modulator 101 may be a unit circuit that includes circuit components known in other approaches, where composition of a specific circuit of the envelope modulator is not limited in this embodiment of the present disclosure.

Optionally, as shown in FIG. 2, as another embodiment of the present disclosure, the power amplifier may further include an upconverter 105, separately connected to a main power amplifier 102 and an auxiliary power amplifier 103, and configured to convert a radio frequency signal to a same operating frequency range as that of the main power amplifier 102 and that of the auxiliary power amplifier 103.

Optionally, as shown in FIG. 2, the power amplifier may further include a power divider 106, connected separately to the upconverter 105, the main power amplifier 102, and the auxiliary power amplifier 103, and configured to divide a radio frequency signal into two signals having a same or different energy, and output the two signals separately to the main power amplifier 102 and the auxiliary power amplifier 103 for signal amplification.

Optionally, as another embodiment of the present disclosure, the power amplifier may include an envelope modulator 101, a main power amplifier 102, an auxiliary power amplifier 103, and a power divider 106, where the power divider 106 directly receives a radio frequency signal, divides the radio frequency signal and then outputs signals obtained after division separately to the main power amplifier 102 and the auxiliary power amplifier 103.

Optionally, as shown in FIG. 2, an output end of the main power amplifier 102 and an output end of the auxiliary power amplifier 103 may be connected to an impedance transformation network 104, and a radio frequency signal after signal amplification reaches, after being processed by the impedance transformation network 104, a combined output end of the power amplifier. The impedance transformation network 104 is configured to perform an impedance match between the main power amplifier 102 and the auxiliary power amplifier 103, that is, to provide a phase difference between the two. The impedance transformation network 104 may include a microstrip impedance transformation network, a bridge impedance transformation network, or any other impedance transformation network, which is not limited in this embodiment of the present disclosure.

Figure 3:
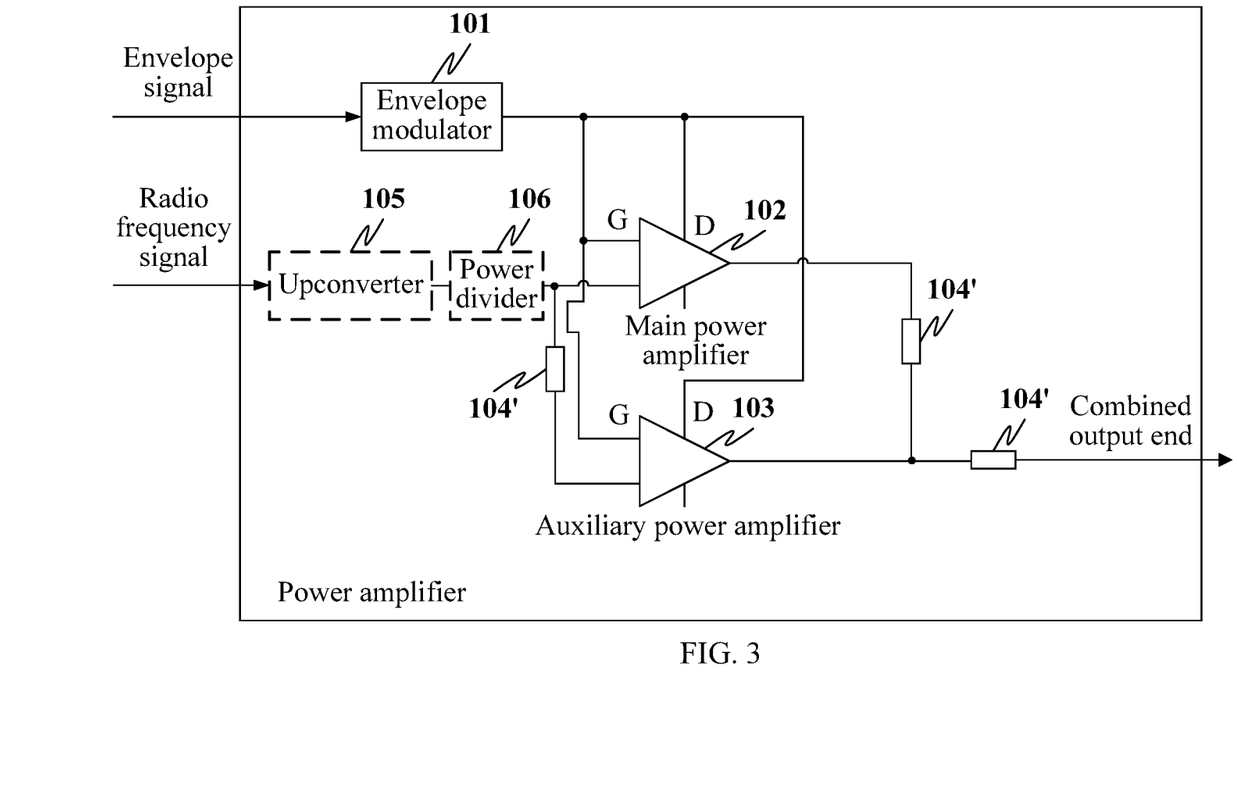
FIG. 3 is a schematic structural diagram of a power amplifier according to an embodiment of the present disclosure.

Optionally, in another embodiment of the present disclosure, as shown in FIG. 3, a power amplifier includes an envelope modulator 101, a main power amplifier 102, an auxiliary power amplifier 103, an upconverter 105, and a power divider 106, where the upconverter 105 and the power divider 106 are optional components. The power amplifier may further include three one-fourth wavelength ($\lambda/4$) transmission lines 104', where one is disposed between source electrodes, that is, signal input ends of the main power amplifier 102 and the auxiliary power amplifier 103, one is disposed between signal output ends of the main power amplifier 102 and the auxiliary power amplifier 103, and another one is disposed at a combined output end of the main power amplifier 102 and the auxiliary power amplifier 103. The $\lambda/4$ transmission line 104' has a function similar to that of an impedance transformation network 104, and can provide a phase difference between the main power amplifier 102 and the auxiliary power amplifier 103.

In an actual implementation, when a Doherty power amplifier part in the power amplifier provided in this embodiment of the present disclosure is designed, any of the foregoing various connecting manners may be used such that a composition form of the power amplifier provided in the present disclosure is flexible, and may be selected according to a performance requirement of the system.

In the actual implementation, the main power amplifier 102 and the auxiliary power amplifier 103 may include one or more transistors or other similar circuit components. A person of ordinary skill in the art may realize that the main power amplifier 102 and the auxiliary power amplifier 103 may be implemented using any other semiconductor technologies known in other approaches, which is not limited in this embodiment of the present disclosure.

Figure 4:
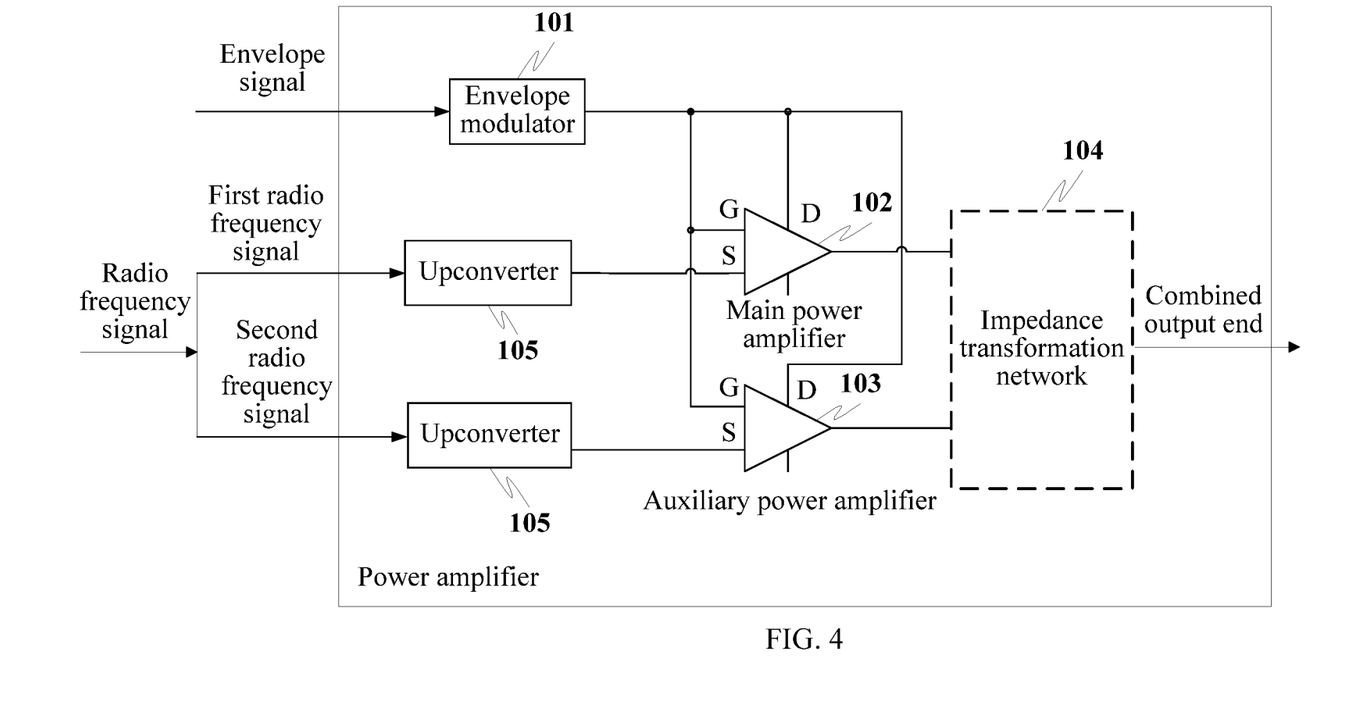
FIG. 4 is a schematic structural diagram of a power amplifier according to an embodiment of the present disclosure.

Optionally, as shown in FIG. 4, in another embodiment of the present disclosure, a power amplifier includes an envelope modulator 101, a main power amplifier 102, an auxiliary power amplifier 103, an impedance transformation network 104, and upconverters 105. The impedance transformation network 104 may be replaced with three $\lambda/4$ transmission lines. For details, reference may be made to description of the embodiment shown in FIG. 3.

The power amplifier may further include two independent signal transmission lines separately corresponding to the main power amplifier 102 and the auxiliary power amplifier 103. Further, a radio frequency signal may be divided in advance into a first radio frequency signal and a second radio frequency signal, which are output separately to the main power amplifier 102 and the auxiliary power amplifier 103 using the two independent signal transmission lines, and then combined and output after signal amplification. An upconverter 105 may be disposed in each signal transmission line, which is referred to as a first upconverter or a second upconverter. Further, the first radio frequency signal may be output to the main power amplifier 102 after being converted by the first upconverter 105, and the second radio frequency signal may be output to the auxiliary power amplifier 103 after being converted by the second upconverter 105. The first radio frequency signal and the second radio frequency signal are relevant signals, represent the same baseband data signal, and have a same time delay. After conversion, phases and/or amplitudes of the two signals may be different, and the amplitudes and the phases may be controlled separately. A person skilled in the art may select a suitable signal dividing manner according to a design requirement of a system, which is not limited in this embodiment of the present disclosure.

Using the power amplifier provided in this embodiment of the present disclosure, a main power amplifier 102 and an auxiliary power amplifier 103 both use an envelope voltage output by an envelope modulator 101 as operating voltages, and the envelope voltage is a fixed voltage such that the power amplifier operates in an ordinary Doherty amplifier mode when an envelope signal is less than a preset threshold, or the envelope voltage varies with an amplitude of the envelope signal when the envelope signal is greater than a preset threshold such that the power amplifier operates in an envelope tracking Doherty amplifier mode. Because the operating voltages of the main power amplifier 102 and the auxiliary power amplifier 103 may be adjusted simultaneously, symmetry of the power amplifier is improved, and there is a low probability that an efficiency loss occurs. Using an efficiency advantage of a Doherty amplifier under power back-off, and in combination with an envelope tracking technology, saturation power of power amplification is improved, thereby enhancing efficiency of the power amplifier. Particularly, in an operating state in which a signal of high power and of a high peak-to-average ratio is amplified, high efficiency may be reached.

Figure 5:
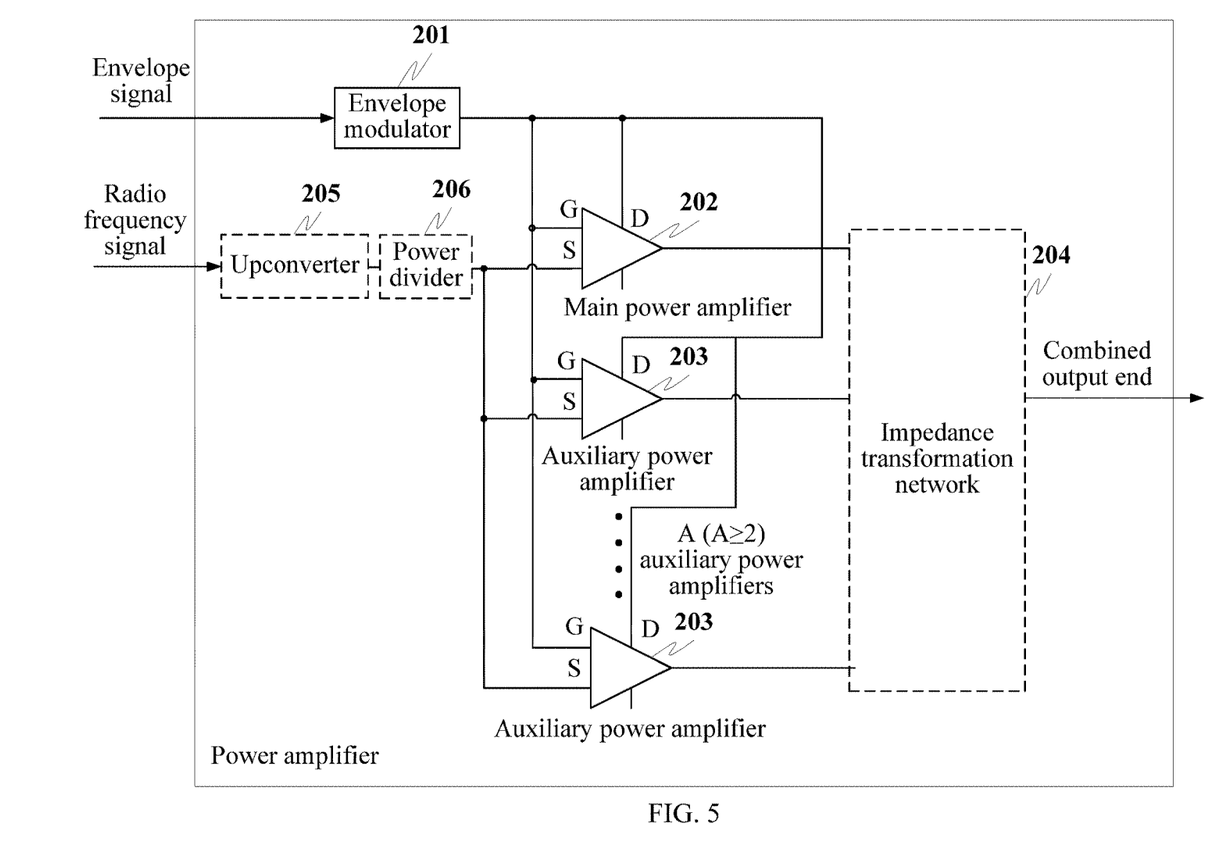
FIG. 5 is a schematic structural diagram of another power amplifier according to an embodiment of the present disclosure.

FIG. 5 is a schematic structural diagram of another power amplifier according to an embodiment of the present disclosure.

As shown in FIG. 5, the power amplifier provided in this embodiment of the present disclosure includes an envelope modulator 201, a main power amplifier 202, and A auxiliary power amplifiers 203, where A is greater than or equal to 2, and A is an integer.

The power amplifier may further include an impedance transformation network 204, an upconverter 205, and a power divider 206. It may be understood that optional functional modules listed in embodiments shown in FIG. 1 to FIG. 4 are also applicable to a structure of the embodiment shown in FIG. 5. For example, the impedance transformation network 204 may be replaced with a plurality of λ/4 transmission lines, including that a λ/4 transmission line is disposed separately between a source electrode of the main power amplifier 202 and a source electrode of each auxiliary power amplifier 203, a λ/4 transmission line is disposed separately between a signal output end of the main power amplifier 202 and a signal output end of each auxiliary power amplifier 203, and a λ/4 transmission line is disposed at a combined output end of the main power amplifier 202 and the A auxiliary power amplifiers 203, and the power divider 206 may be replaced with two independent signal transmission lines separately corresponding to the main power amplifier 202 and the A auxiliary power amplifiers 203, where the main power amplifier 202 receives a radio frequency signal, and the A auxiliary power amplifiers 203 receive the other radio frequency signal. A person skilled in the art may select to use according to an actual need, which is not limited in this embodiment of the present disclosure. The structure shown in FIG. 5 is only an optional implementation solution.

A D end of the main power amplifier 202 and D ends of the A auxiliary power amplifiers 203 are connected separately to the envelope modulator 201, and the main power amplifier 202 and the A auxiliary power amplifiers 203 receive a same envelope voltage separately from the envelope modulator 201 as operating voltages, for performing amplification processing on a radio frequency signal.

In the power amplifier, the envelope modulator 201 may further be connected separately to a G end of the main power amplifier 202 and G ends of the A auxiliary power amplifiers 203 in order to assist in controlling, using the envelope voltage output by the envelope modulator 201 as a gate voltage, operating states of the main power amplifier and the auxiliary power amplifiers, thereby further adjusting a power amplification gain, and improving power amplification performance.

It may be understood that a quantity of the auxiliary power amplifiers may be determined according to a system requirement, that is, a Doherty amplifier part in the power amplifier provided in this embodiment of the present disclosure may be a multi-channel Doherty power amplifier shown in FIG. 3, which may include two or more auxiliary power amplifiers.

During an actual application, an implementation manner of the Doherty amplifier part in the power amplifier provided in this embodiment of the present disclosure is not limited, and in addition to a structure of the multi-channel Doherty amplifier, a structure inverse to that of the Doherty amplifier may be designed, which is not limited in this embodiment of the present disclosure.

For description brevity, for description about a detailed structure, and connection relationships between and functions of modules of the power amplifier provided in the embodiment shown in FIG. 5, reference may be made to related content of the embodiments shown in FIG. 1 to FIG. 4, which is not described herein in detail.

Using the power amplifier provided in the embodiment shown in FIG. 5, because the quantity of the auxiliary power amplifiers increases, larger output power may be generated, and device performance is further improved.

Figure 6:
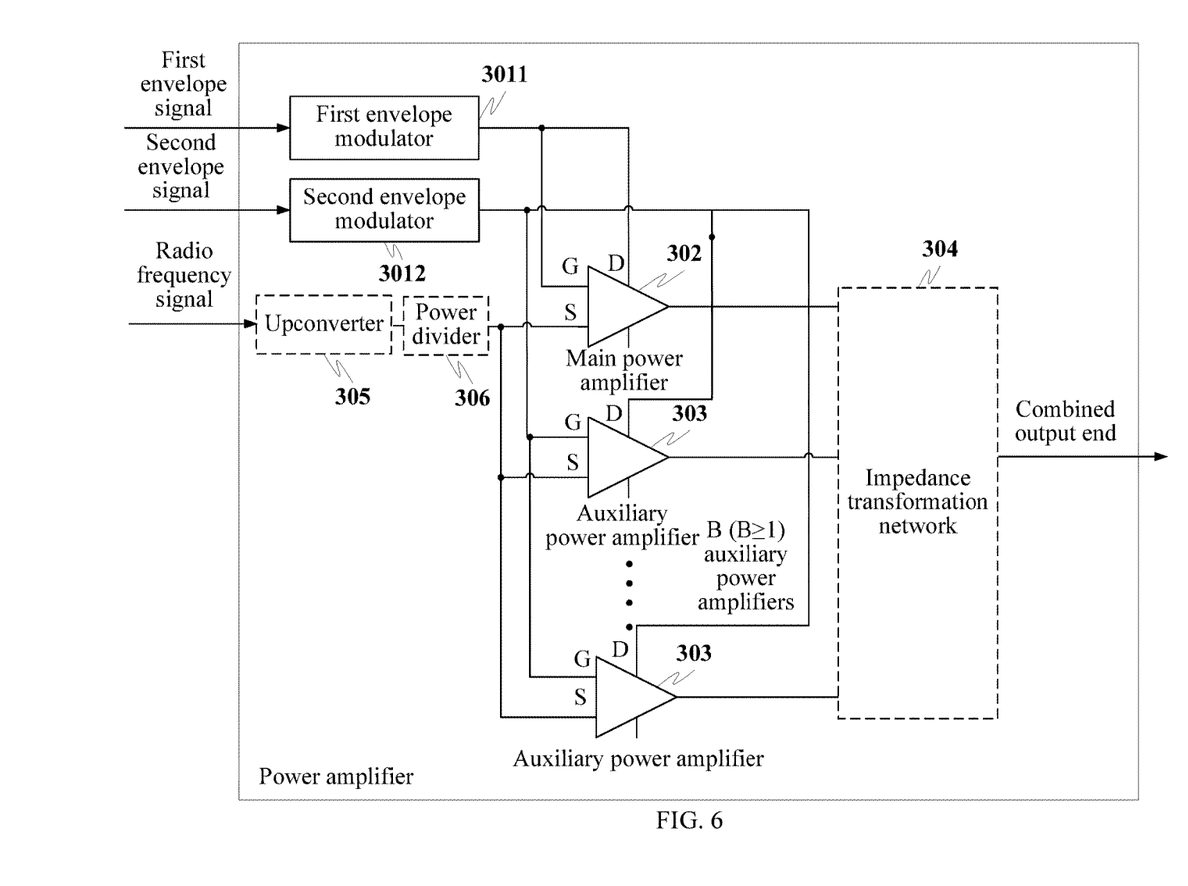
FIG. 6 is a schematic structural diagram of still another power amplifier according to an embodiment of the present disclosure.

FIG. 6 is a schematic structural diagram of still another power amplifier according to an embodiment of the present disclosure.

As shown in FIG. 6, the power amplifier provided in this embodiment of the present disclosure includes a first envelope modulator 3011, a second envelope modulator 3012, a main power amplifier 302, and B auxiliary power amplifiers 303, where B is greater than or equal to 1, and B is an integer, where the first envelope modulator 3011 is connected to a D end of the main power amplifier 302, the second envelope modulator 3012 is separately connected to drain electrodes of the B auxiliary power amplifiers 303, and the main power amplifier 302 is parallelly connected to the B auxiliary power amplifiers 303.

In the power amplifier, the first envelope modulator 3011 may further be connected to a G end of the main power amplifier 302 and the second envelope modulator 3012 may further be separately connected to gate electrodes of the B auxiliary power amplifiers 302 in order to assist in controlling, using envelope voltages output by the envelope modulators 3011 and 3012 as gate voltages, operating states of the main power amplifier 302 and the auxiliary power amplifiers 303, thereby further adjusting a power amplification gain, and improving power amplification performance.

The power amplifier may further include an impedance transformation network 304, an upconverter 305, and a power divider 306, and connection relationships are shown in FIG. 6. It may be understood that optional functional modules listed in embodiments shown in FIG. 1 to FIG. 4 are also applicable to a structure of the embodiment shown in FIG. 6. For example, the impedance transformation network 304 may be replaced with a plurality of λ/4 transmission lines, including that a λ/4 transmission line is disposed separately between a source electrode of the main power amplifier 302 and a source electrode of each auxiliary power amplifier 303, a λ/4 transmission line is disposed separately between a signal output end of the main power amplifier 302 and a signal output end of each auxiliary power amplifier 303, and a λ/4 transmission line is disposed at a combined output end of the main power amplifier 302 and the B auxiliary power amplifiers 303, and the power divider 306 may be replaced with two independent signal transmission lines separately corresponding to the main power amplifier 302 and the B auxiliary power amplifiers 303. A person skilled in the art may select to use according to an actual need, which is not limited in this embodiment of the present disclosure. The structure shown in FIG. 6 is only an optional implementation solution.

The first envelope modulator 3011 is configured to receive a first envelope signal, obtain a first envelope voltage according to the first envelope signal, and output the first envelope voltage to the main power amplifier 302, and the main power amplifier 302 performs, using the first envelope voltage as an operating voltage, amplification processing on a signal input from an S end.

The second envelope modulator 3012 is configured to receive a second envelope signal, obtain a second envelope voltage according to the second envelope signal, and output the second envelope voltage to the B auxiliary power amplifiers 303, and the B auxiliary power amplifiers 303 perform, using the second envelope voltage as operating voltages, amplification processing on a signal input from source electrodes.

Optionally, the first envelope signal and the second envelope signal may be generated by an RRU, or the like, and are respectively input into the first envelope modulator 3011 and the second envelope modulator 3012.

It may be understood that the signals input from the source electrodes of the main power amplifier 302 and the B auxiliary power amplifiers 303 may be a same radio frequency signal to be amplified, or signals that can represent a same radio frequency signal to be amplified after being overlapped.

Optionally, the first envelope modulator 3011 may process, under control of a first modulator control signal, the first envelope signal to obtain the first envelope voltage, and the second envelope modulator 3012 may process, under control of a second modulator control signal, the second envelope signal to obtain the second envelope voltage.

Optionally, by adjusting the first modulator control signal and the second modulator control signal, a proportional relationship between the first envelope voltage and the second envelope voltage may correspond to a ratio of an output power of the main power amplifier 302 to those of the B auxiliary power amplifiers 303. Further, according to an expected ratio of an operating voltage of the main power amplifier 302 to those of the B auxiliary power amplifiers 303, a suitable first modulator control signal and second modulator control signal are set such that a ratio of a first envelope voltage output by the first envelope modulator 3011 and supplied for the main power amplifier 302 to a second envelope voltage output by the second envelope modulator 3012 and supplied for the B auxiliary power amplifiers 303 may be controlled to be equal or corresponding to the foregoing output power ratio, to ensure that a ratio of an operating voltage of the main power amplifier 302 to those of the B auxiliary power amplifiers 303 maintains constant, thereby amplifying radio frequency signals synchronously, and keeping symmetry of the amplifier.

Optionally, the first modulator control signal and the second modulator control signal may be generated by an RRU, or the like.

It should be noted that the first modulator control signal and the second modulator control signal may be of a same type or of different types, and may have relevant or irrelevant parameters such as amplitudes and phases. It only needs to ensure that the envelope voltages output after being processed by the envelope modulators 3011 and 3012 satisfy a proportional relationship, which is not limited in this embodiment of the present disclosure.

The foregoing output power ratio is determined by performance of power tubes selected as the main power amplifier 302 and the auxiliary power amplifier 303, for example, if output power of a power tube used as the main power amplifier 302 is 100 watts(W), and output power of a power tube used as the auxiliary power amplifier is 200 W, the output power ratio is 1:2, and the first modulator control signal and the second modulator control signal are determined as required by the output power ratio such that a ratio of the first envelope voltage obtained after the first envelope signal is processed by the first envelope modulator 3011 to the second envelope voltage obtained after the second envelope signal is processed by the second envelope modulator 3012 is also equal or approximate to 1:2.

Optionally, the first envelope modulator 3011 may process, according to a first signal threshold, the foregoing first envelope signal to obtain a fixed voltage or a varying voltage that varies with an amplitude of the foregoing first envelope signal, and the second envelope modulator 3012 may process, according to a second signal threshold, the foregoing second envelope signal to obtain a fixed voltage or a varying voltage that varies with an amplitude of the foregoing second envelope signal. The first preset threshold and the second preset threshold may be set and adjusted independently, and may be set to a same threshold or different thresholds according to a performance requirement of the amplifier, which is not limited in this embodiment of the present disclosure.

Optionally, the first envelope signal and the second envelope signal may be relevant signals obtained after an original envelope signal of a same radio frequency signal is processed using different functions, and the first envelope voltage obtained after being processed according to the first envelope signal and the second envelope voltage obtained after being processed according to the second envelope signal are relevant envelope voltages.

Optionally, the first envelope signal and the second envelope signal may also be a same envelope signal obtained after an original envelope signal of a radio frequency signal is processed using a preset function, and are respectively output to the first envelope modulator 3011 and the second envelope modulator 3012. Because signal thresholds may be set independently for the first envelope modulator 3011 and the second envelope modulator 3012, the first envelope voltage and the second envelope voltage obtained after being processing may be a same envelope voltage or relevant envelope voltages. Regardless of whether the same or relevant envelope voltages are obtained after being processing, under actions of the first modulator control signal and the second modulator control signal, the first envelope voltage and the second envelope voltage may always maintain a fixed proportional relationship.

For description brevity, for description about a detailed structure, and connection relationships between and functions of modules of the power amplifier provided in the embodiment shown in FIG. 6, reference may be made to related content of the embodiments shown in other embodiments of the present disclosure, which is not described herein in detail.

Using the power amplifier provided in the embodiment in FIG. 6, envelope channels of the main power amplifier 302 and the B auxiliary power amplifiers 303 are configured independently, the main power amplifier 302 and the B auxiliary power amplifiers 303 may set and adjust the envelope voltages separately, and meanwhile the envelope voltage ratio matches the output power ratio of the amplifier, which has good flexibility, and may further improve performance of the amplifier.

It may be known from description of the forgoing embodiment that, quantities of the envelope modulators and the auxiliary power amplifiers in the power amplifier provided in this embodiment of the present disclosure may be determined according to a system requirement, and the connection relationships between the modules also vary correspondingly, which is not limited in this embodiment of the present disclosure. For example, C auxiliary power amplifiers and C+1 envelope modulators may be disposed, where C is greater than or equal to 2, where one of the C+1 envelope modulators is connected to the main power amplifier, and the remaining C envelope modulators are respectively connected to the C auxiliary power amplifiers, that is, the envelope modulators are in a one-to-one correspondence to the auxiliary power amplifiers, and each envelope modulator may be controlled independently. For another example, similar to the embodiment shown in FIG. 5, C auxiliary power amplifiers and two envelope modulators may be disposed, where C is greater than or equal to 2, where one envelope modulator is connected to the main power amplifier, and the other envelope modulator is connected to the C auxiliary power amplifiers simultaneously, for providing an operating voltage for the C auxiliary power amplifiers, or one envelope modulator is connected to the main power amplifier and some of the auxiliary power amplifiers, and the other envelope modulator is connected to the remaining auxiliary power amplifiers. That is, it only needs to ensure that operating voltages of a main power amplifier and auxiliary power amplifiers are all provided by envelope voltages output by envelope modulators, and a ratio of an operating voltage of the main power amplifier to those of the auxiliary power amplifiers corresponds to an output power ratio.

Figure 7:
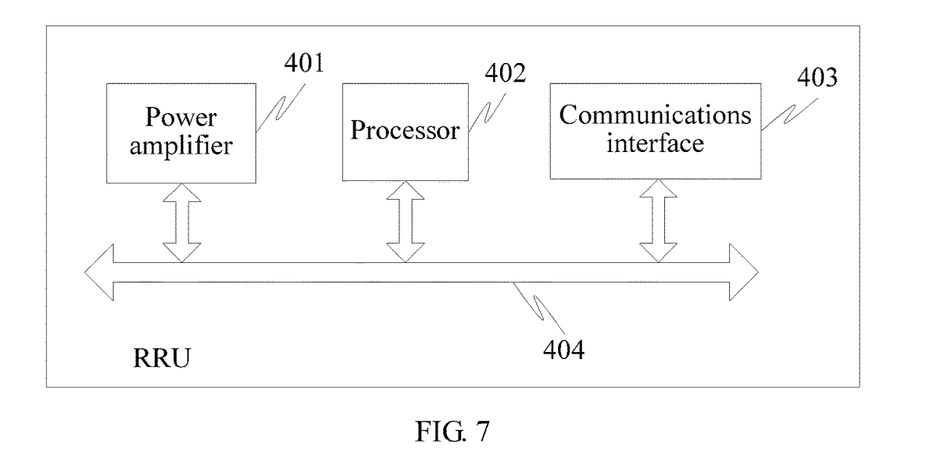
FIG. 7 is a schematic structural diagram of an RRU according to an embodiment of the present disclosure.

As shown in FIG. 7, an embodiment of the present disclosure further provides an RRU, including a power amplifier 401. The power amplifier 401 may be the power amplifier shown in any embodiment of FIG. 1 to FIG. 6 or an apparatus having a same function. For description about an internal structure and function of the power amplifier 401, reference may be made to other embodiments of the present disclosure, which is not described herein in detail.

The RRU may further include a processor 402 configured to extract an original envelope signal of a radio frequency signal to be amplified, process the original envelope signal using a preset function, to obtain an envelope signal, and output the envelope signal to the power amplifier 401. The power amplifier 401 processes the envelope signal to obtain an envelope voltage, which is used as an operating voltage of the power amplifier 401.

Optionally, the processor 402 may further be configured to generate a modulator control signal and output the modulator control signal to the power amplifier 401, where the modulator control signal may be used to control an amplitude of the foregoing envelope voltage.

Optionally, when the power amplifier 401 includes a first envelope modulator connected to a main power amplifier, and a second envelope modulator connected to an auxiliary power amplifier, the processor 402 may be configured to generate a first modulator control signal corresponding to the first envelope modulator, and a second modulator control signal corresponding to the second envelope modulator. For details, reference may be made to description of the embodiment shown in FIG. 6, which is not described herein in detail.

The processor 402 may communicate with the power amplifier 401 directly or indirectly.

It may be understood that the foregoing processor 402 may be disposed independently, or a function thereof may also be integrated in an existing functional module, for example, an intermediate frequency module or a transceiver module, of the RRU, which is not limited in this embodiment of the present disclosure. During an actual implementation, the function of the processor 402 may be integrated on a baseband chip.

The RRU may further include a communications interface 403 configured to communicate with another apparatus, for example, a baseband unit (BBU) in a base station directly or indirectly.

Optionally, the communications interface 403 may be a common public radio interface (CPRI), an open base station architecture initiative (OBSAI) interface, or the like.

Connection manners of the power amplifier 401, the processor 402, and the communications interface 403 are not limited. As shown in FIG. 7, the power amplifier 401, the processor 402, and the communications interface 403 may be connected using a communications bus 404 for signal transmission.

For clear and brief description, this embodiment of the present disclosure uses a power amplifier 401 disposed in an RRU for description. A person skilled in the art may understand that the power amplifier 401 may also be disposed in another similar radio frequency functional module, which is not limited in this embodiment of the present disclosure.

Figure 8:
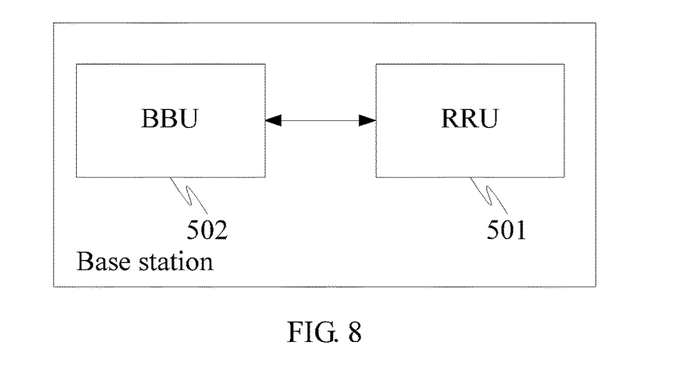
FIG. 8 is a schematic structural diagram of a base station according to an embodiment of the present disclosure.

As shown in FIG. 8, an embodiment of the present disclosure further provides a base station, including an RRU 501 and a BBU 502. The RRU 501 may be the RRU shown in the embodiment of FIG. 7 or a device having a same function, and the RRU 501 and the BBU 502 may communicate directly or indirectly.

Using the RRU or the base station provided in this embodiment of the present disclosure, a main power amplifier and an auxiliary power amplifier that are used in a power amplification part both use an envelope voltage output by an envelope modulator as operating voltages, and the envelope voltage is a fixed voltage when an envelope signal is less than a preset threshold such that the power amplifier operates in an ordinary Doherty amplifier mode, or the envelope voltage varies with an amplitude of the envelope signal when the envelope signal is greater than a preset threshold such that the power amplifier operates in an envelope tracking Doherty amplifier mode. Because the operating voltages of the main power amplifier and the auxiliary power amplifier may be adjusted simultaneously, symmetry of the power amplifier is improved, and there is a low probability that an efficiency loss occurs. Using an efficiency advantage of a Doherty amplifier under power back-off, and in combination with an envelope tracking technology, saturation power of power amplification is improved, thereby enhancing efficiency of the power amplifier. Particularly, in an operating state in which a signal of high power and of a high peak-to-average ratio is amplified, high efficiency may be reached.

It may be understood that various proper modifications may be made by a person of ordinary skill in the art to quantities of envelope modulators and auxiliary power amplifiers of a power amplifier and to corresponding connection relationships according to description of the embodiments of the present disclosure, without creative efforts, and shall fall within the protection scope of the present disclosure.

In the several embodiments provided in the present application, it should be understood that the disclosed device and method may be implemented in other manners. For example, the described apparatus embodiment is merely exemplary. For example, the module division is merely logical function division and may be other division in actual implementation. For example, a plurality of modules or components may be combined or integrated into another device, or some features may be ignored or not performed.

In addition, functional modules in the embodiments of the present disclosure may be integrated into one processing module, or each of the modules may exist alone physically, or two or more modules are integrated into one module.

A person of ordinary skill in the art may understand that all or some of the steps of the embodiments may be implemented by hardware or a program instructing related hardware. The program may be stored in a computer-readable storage medium. The storage medium may include a read-only memory, a magnetic disk, or an optical disc.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A power amplifier, comprising:
a first envelope modulator connected to a drain electrode of a main power amplifier and configured to:
obtain a first envelope voltage according to a received first envelope signal; and
output the first envelope voltage to the drain electrode of the main power amplifier;
a second envelope modulator connected to a drain electrode of an auxiliary power amplifier and configured to:
obtain a second envelope voltage according to a received second envelope signal; and
output the second envelope voltage to the drain electrode of the auxiliary power amplifier,
wherein the main power amplifier, when in an operating state, is configured to:
set the first envelope voltage received from the first envelope modulator as an operating voltage; and
perform amplification processing on a signal input from a source electrode of the main power amplifier, and
wherein the auxiliary power amplifier is connected in parallel to the main power amplifier and, when in an operating state, is configured to:
set the second envelope voltage received from the second envelope modulator as an operating voltage; and
perform the amplification processing on a signal input from a source electrode of the auxiliary power amplifier, wherein a proportional relationship between the first envelope voltage and the second envelope voltage corresponds to a ratio of an output power of the main power amplifier to the auxiliary power amplifier.

2. The power amplifier according to claim 1, wherein the first envelope modulator is connected to a gate electrode of the main power amplifier, wherein the first envelope modulator is further configured to output the first envelope voltage to the gate electrode of the main power amplifier, wherein the second envelope modulator is connected to a gate electrode of the auxiliary power amplifier, and wherein the second envelope modulator is further configured to output the second envelope voltage to the gate electrode of the auxiliary power amplifier.

3. The power amplifier according to claim 1, further comprising an upconverter separately connected to the source electrode of the main power amplifier and the source electrode of the auxiliary power amplifier and configured to:
convert a radio frequency signal to a same operating frequency range as of the main power amplifier and of the auxiliary power amplifier; and
output a signal obtained after conversion separately to the main power amplifier and the auxiliary power amplifier.

4. The power amplifier according to claim 1, further comprising an impedance transformation network separately connected to an output end of the main power amplifier and an output end of the auxiliary power amplifier and configured to provide a phase difference between the main power amplifier and the auxiliary power amplifier.

5. The power amplifier according to claim 1, further comprising a power divider separately connected to the source electrode of the main power amplifier and the source electrode of the auxiliary power amplifier and configured to:
divide a radio frequency signal into two signals; and
output the two signals separately to the main power amplifier and the auxiliary power amplifier.

6. The power amplifier according to claim 1, wherein the first envelope signal and the second envelope signal are obtained after an original envelope signal of a radio frequency signal is processed using a same function.

7. The power amplifier according to claim 1, wherein the first envelope signal and the second envelope signal are obtained after an original envelope signal of a radio frequency signal is processed using different functions.

8. The power amplifier according to claim 1, wherein the first envelope modulator is configured to process, according to a first signal threshold, the received first envelope signal to obtain a fixed voltage as the first envelope voltage or a varying voltage that varies with an amplitude of the received first envelope signal as the first envelope voltage.

9. The power amplifier according to claim 1, wherein the second envelope modulator is configured to process, according to a second signal threshold, the received second envelope signal to obtain a fixed voltage as the second envelope voltage or a varying voltage that varies with an amplitude of the received second envelope signal as the second envelope voltage.

10. A radio remote unit (RRU), comprising a power amplifier, wherein the power amplifier comprises:
- a first envelope modulator connected to a drain electrode of a main power amplifier and configured to:
  - obtain a first envelope voltage according to a received first envelope signal; and
  - output the first envelope voltage to the drain electrode of the main power amplifier;
- a second envelope modulator connected to a drain electrode of an auxiliary power amplifier and configured to:
  - obtain a second envelope voltage according to a received second envelope signal; and
  - output the second envelope voltage to the drain electrode of the auxiliary power amplifier;
- wherein the main power amplifier, when in an operating state, is configured to:
  - set the first envelope voltage received from the first envelope modulator as an operating voltage; and
  - perform amplification processing on a signal input from a source electrode of the main power amplifier, and
- wherein the auxiliary power amplifier is connected in parallel to the main power amplifier and, when in an operating state, is configured to:
  - set the second envelope voltage received from the second envelope modulator as an operating voltage; and
  - perform the amplification processing on a signal input from a source electrode of the auxiliary power amplifier, wherein a proportional relationship between the first envelope voltage and the second envelope voltage corresponds to a ratio of an output power of the main power amplifier to that of the auxiliary power amplifier.

* * * * *